(12) United States Patent
Akbari-Dilmaghani

(10) Patent No.: US 12,085,592 B2
(45) Date of Patent: Sep. 10, 2024

(54) CURRENT PEAK SENSOR FOR PULSED LASER DIODE ARRAY

(71) Applicant: ams AG, Premstaetten (AT)

(72) Inventor: Rahim Akbari-Dilmaghani, Graz (AT)

(73) Assignee: ams AG, Premstaetten (AT)

( * ) Notice: Subject to any disclaimer, the term of this patent is extended or adjusted under 35 U.S.C. 154(b) by 735 days.

(21) Appl. No.: 17/413,499

(22) PCT Filed: Dec. 6, 2019

(86) PCT No.: PCT/EP2019/084093
§ 371 (c)(1),
(2) Date: Jun. 11, 2021

(87) PCT Pub. No.: WO2020/126575
PCT Pub. Date: Jun. 25, 2020

(65) Prior Publication Data
US 2022/0074975 A1 Mar. 10, 2022

Related U.S. Application Data

(60) Provisional application No. 62/780,446, filed on Dec. 17, 2018.

(51) Int. Cl.
*G01R 19/04* (2006.01)
*G01R 19/25* (2006.01)
(Continued)

(52) U.S. Cl.
CPC ......... *G01R 19/04* (2013.01); *G01R 19/2506* (2013.01); *G01S 7/4804* (2013.01);
(Continued)

(58) Field of Classification Search
CPC ... G01R 19/04; G01R 19/2506; G01S 7/4804; G01S 7/4861; H01S 5/0428; H01S 5/4025
(Continued)

(56) References Cited

U.S. PATENT DOCUMENTS 4,701,609 A 10/1987 Koishi et al.
4,965,512 A 10/1990 Debar et al.
(Continued)

FOREIGN PATENT DOCUMENTS

CN 108776277 A 11/2018

OTHER PUBLICATIONS

CN Appl. No. 201980083864.5, "Office Action", Jun. 24, 2023, 7 pages.
(Continued)

*Primary Examiner* — William Hernandez
(74) *Attorney, Agent, or Firm* — Viering, Jentschura & Partner mbB; Robert M Bilotta, Jr.

(57) ABSTRACT

An apparatus and method for current peak detection. The apparatus includes a pulse laser diode array, a sense resistor, a capacitive voltage divider (CVD) electrically coupled to the pulse laser diode array, a first current rectifier, a second current rectifier, a first current peak detector, a second current peak detector, an analog-to-digital converter (ADC) operable to convert the analog outputs from each current peak detector to a digital output signal, and a digital signal processing (DSP) unit operable to detect, from the digital output signal, a current peak pulse at the top and the bottom of the sense resistor.

15 Claims, 5 Drawing Sheets

(51) Int. Cl.
  *G01S 7/48*      (2006.01)
  *G01S 7/4861*    (2020.01)
  *H01S 5/042*     (2006.01)
  *H01S 5/40*      (2006.01)

(52) U.S. Cl.
  CPC .......... *G01S 7/4861* (2013.01); *H01S 5/0428* (2013.01); *H01S 5/4025* (2013.01)

(58) Field of Classification Search
  USPC ......................................................... 327/58
  See application file for complete search history.

(56) References Cited

U.S. PATENT DOCUMENTS

| | | |
|---|---|---|
| 2010/0264301 A1 | 10/2010 | Borosak |
| 2015/0022318 A1 | 1/2015 | Akbari-Dilmaghani |
| 2015/0036707 A1 | 2/2015 | Fulkerson |
| 2021/0305770 A1* | 9/2021 | Colles .................. H01S 5/0428 |

OTHER PUBLICATIONS

Kostamovaara J. et al. "A 250-MHz Bi CMOS 1-15 Receiver Channel With Leading Edge Timing Discriminator for a Pulsed Time-of-Flight Laser Rangefinder" IEEE Journal of Soli-State Circuits, IEEE Service Center, Piscataway, NJ, USA, vol. 40, No. 6, Jun. 1, 2005 (Jun. 1, 2005), pp. 1341-1349.

* cited by examiner

CURRENT PEAK SENSOR FOR PULSED LASER DIODE ARRAY

CROSS-REFERENCE TO RELATED APPLICATIONS

This application is a 371 U.S. National Phase of PCT International Patent Application No. PCT/EP2019/084093, filed on Dec. 6, 2019, which claims benefit and priority to U.S. provisional patent application No. 62/780,446, filed on Dec. 17, 2018; the disclosures of which are each incorporated by reference herein in their entirety for all purposes.

BACKGROUND

Light detection and ranging (LiDAR) systems are based on direct time-of-flight (DTOF) and are used in spacecraft navigation, assembly-line robotics, augmented and virtual reality (AR/VR), (drone-based) surveillance, advanced driver assistance systems (ADAS), and autonomous cars. High speed sensing of the pulsed laser diode current is required for eye safety in LiDAR applications. A LiDAR sensor can include an optical remote sensing module that can measure the distance to a target or objects in a scene, by irradiating the target or scene with light, using pulses (or alternatively a modulated signal) from a laser, and measuring the time it takes photons to travel to said target or landscape and return after reflection to a receiver in the LiDAR module. The reflected pulses (or modulated signals) are detected, with the time of flight and the intensity of the pulses (or modulated signals) being measures of the distance and the reflectivity of the sensed object, respectively.

Conventional LiDAR sensors utilize mechanically moving parts for scanning laser beams. In some systems, including certain systems used in automotive applications, such as advanced driver assist systems (ADAS) and autonomous driving systems, it is preferred to use solid state sensors for a variety of potential advantages including but not limited to higher sensor reliability, longer sensor lifetime, smaller sensor size, lower sensor weight, and lower sensor cost.

Radio frequency (RF) delay lines used for the creation of radar phased arrays were used several decades ago for the solid state steering of radar signals. Photonic integrated circuit (PIC) based delay lines combined with detectors and RF antenna arrays were used two decades ago to improve the precision of delays in the solid state steering of radar signals. PICs with microscale and nanoscale devices can be used to produce optical phased arrays (OPAs), comprising tunable optical delay lines and optical antennas, for the solid state steering of laser beams. Phased arrays can be complex, costly and/or have a different purpose than beam forming and beam steering.

SUMMARY

This specification describes technologies relating to high speed sensing of pulsed laser diode current in LiDAR applications utilizing scaled down very high junction voltages of laser diode array's and low voltage complementary metal-oxide-semiconductor (CMOS) devices, which can handle high speed signals more efficiently in terms of power and die area.

In general, one innovative aspect of the subject matter described in this specification can be embodied in an apparatus including a pulse laser diode array, a sense resistor operable to traverse pulsed laser current to the pulse laser diode array, a capacitive voltage divider (CVD) electrically coupled to the pulse laser diode array and includes a first input node for receiving a direct current (DC) input voltage, wherein a top end of the sense resistor is electrically coupled to the first input node, a second input node for receiving a pulsed laser current generated by the pulse laser diode array, wherein a bottom end of the sense resistor is electrically coupled to the second input node, and a first and a second output node that each respectively output a scaled DC output voltage, a first current rectifier electrically coupled to the first output node of the CVD, a second current rectifier electrically coupled to the second output node of the CVD, a first current peak detector electrically coupled to an output of the first current rectifier, a second current peak detector electrically coupled to an output of the second current rectifier, an analog-to-digital converter (ADC) electrically coupled to an output of the first current peak detector and an output of the second current peak detector and operable to convert the analog outputs from each current peak detector to a digital output signal, and a digital signal processing (DSP) unit electrically coupled to an output of the ADC and operable to detect, from the digital output signal, a current peak pulse at the top and the bottom of the sense resistor.

Some implementations include one or more of the following features.

In some implementations, the DSP unit is further operable to calculate a difference in peak currents between the determined peak current levels at the top and the bottom of the sense resistor. In some implementations, the DC input voltage is pulsed by a laser driver at an input switch electrically coupled to the first input node of the CVD. In some implementations, the CVD is operable to scale a voltage generated between the pulse laser diode array and the DC input voltage across the sense resistor.

In some implementations, each current rectifier is operable to receive a scaled voltage from the CVD, convert the scaled voltage to a scaled current, rectify the scaled current, and provide, for output, the rectified scaled current at the output of the respective current rectifier.

In some implementations, each current peak detector is operable to receive a rectified scaled current from a current rectifier, determine a peak current level of the rectified scaled current, and provide, for output, the peak current level of the rectified scaled current at the output of the respective current peak detector.

In some implementations, the ADC is operable to perform signal conditioning according to a voltage mode or a current mode. In some implementations, the first output node of the CVD comprises a scaled output voltage for the top end of the sense resistor and the second output node of the CVD comprises a scaled output voltage for the bottom end of the sense resistor. In some implementations, the digital output signal is indicative of the photocurrent generated by the pulse laser diode array.

In general, one innovative aspect of the subject matter described in this specification can be embodied in a method for current peak detection including generating, by a pulse laser diode array, a photocurrent (IPD), wherein the photocurrent generates an offset voltage across a sense resistor electrically coupled between the pulse laser diode array and a direct current (DC) input voltage source, converting, by a capacitive voltage divider (CVD) electrically coupled to the pulse laser diode array, the offset voltage across the sense resistor to a scaled down voltage, converting, by a rectifier circuit electrically coupled to the CVD, the scaled down voltage to a scaled down current, rectifying, by the rectifier circuit, the scaled down current to a rectified current signal, detecting, by a current peak detector circuit electrically coupled to the rectifier circuit, a peak level of the rectified current signal, converting, by an analog-to-digital converter (ADC), the rectified current signal into a digital output signal, and determining, by a digital signal processing (DSP) unit electrically coupled to the ADC, and based on the digital output signal, a peak current pulse at a top and a bottom of the sense resistor.

Some implementations include one or more of the following features.

In some implementations, the method further includes calculating, by the DSP, a difference in peak currents between the determined peak current levels at the top and the bottom of the sense resistor. In some implementations, the DC input voltage is pulsed by a laser driver at an input switch electrically coupled to a node at the top of the sense resistor. In some implementations, the rectifier circuit includes a first current rectifier electrically coupled to a first output node of the CVD and a first input node of the current peak detector circuit, and a second current rectifier electrically coupled to a second output node of the CVD and a first input node of the current peak detector circuit. In some implementations, the current peak detector circuit includes a first current peak detector electrically coupled to an output node of the first current rectifier and a first input node of the ADC, and a second current peak detector electrically coupled to an output node of the second current rectifier and a first input node of the ADC. In some implementations, converting the rectified current signal into a digital output signal includes performing signal conditioning according to a voltage mode or a current mode of the ADC.

Some embodiments of the subject matter described in this specification can be implemented so as to realize one or more of the following advantages. By using the disclosed circuit arrangement as an integrated laser-diode driver for LiDAR applications required to be implemented in high voltage CMOS technologies, significant voltage drop associated with parasitic inductances may be reduced. Additionally, this technique is useful to benefit from the availability of power switches that permits high peak current up to 5-10 A with a corresponding fast rise-time of 1ns or less, fall-time of 2 ns and pulse duration of 3-20 ns. The circuit arrangement and method described herein enables to scale down very high junction voltages of laser diode array without losing its important high frequency signal components, and consequently to use available low voltage CMOS devices which can handle high speed signals more efficiently in terms of power and die area.

Compact, low-cost, Q-switched diode-pumped solid-state lasers (DPPS) with high pulse energy are needed for many applications, such as laser range finders, laser designators, laser breakdown spectroscopy, and laser ignition. In many of those applications, the lasers need to operate at high temperatures where typical edge-emitting laser diode pump lasers show poor reliability. High power vertical-cavity surface-emitting laser (VCSEL) arrays have been demonstrated as excellent pump sources for diode-pumped solid-state lasers. Their key advantages over the existing edge-emitter technology include simpler coupling optics, reduced wavelength sensitivity to temperature, and increased reliability, especially at high temperatures, low-cost manufacturing, and two-dimensional planar scalability. VCSELs are an attractive candidate for IR illumination applications as they offer advantageous properties such as efficiency, intrinsically low diverging circular beam, low-cost manufacturing, narrow emission spectrum, and high reliability. VCSELs can also operate at high temperatures, thereby meeting the harsh environmental requirements of many illuminators. The efficiency and brightness of these VCSELs also reduce the requirements of the power supply compared to, for example, an LED approach. These features make VCSEL technology very well suited for constructing low-cost DPSS lasers with high pulse energy. VCSELs can be used in illuminators emitting from a few watts up to several hundred watts.

The details of one or more embodiments of the subject matter described in this specification are set forth in the accompanying drawings and the description below. Other aspects, features, and advantages will become apparent from the description, the drawings, and the claims.

BRIEF DESCRIPTION OF THE DRAWINGS

Like reference numbers and designations in the various drawings indicate like elements.

DETAILED DESCRIPTION

This disclosure describes an example pulsed laser diode current sensing apparatus that enables high speed sensing of pulsed laser diode current in LIDAR application, which is required for eye safety in LIDAR applications. The example pulsed laser diode current sensing apparatus includes an integrated laser-diode driver for LIDAR applications required to be implemented in high voltage CMOS technologies to combat significant voltage drop associated with parasitic inductances. Additionally, the example pulsed laser diode current sensing apparatus described herein can benefit from availability of power switches that permits high peak current. For example, high peak current range up to 5-10 A with a corresponding fast rise-time of 1ns or less, a fall-time of 2 ns, and a pulse duration of 3-20 ns. Thus, the proposed apparatus and method described herein enables to scale down very high junction voltages of laser diode array without losing its important high frequency signal components, and consequently to use available low voltage CMOS devices which can handle high speed signals more efficiently in terms of power and die area.

This document describes an arrangement that optimizes a circuit arrangement with low complexity in terms of required die are which is important for realization of N×N VCSEL arrays required in LIDAR applications.

These features, as well as additional features, are described in more detail below.

Figure 1A:
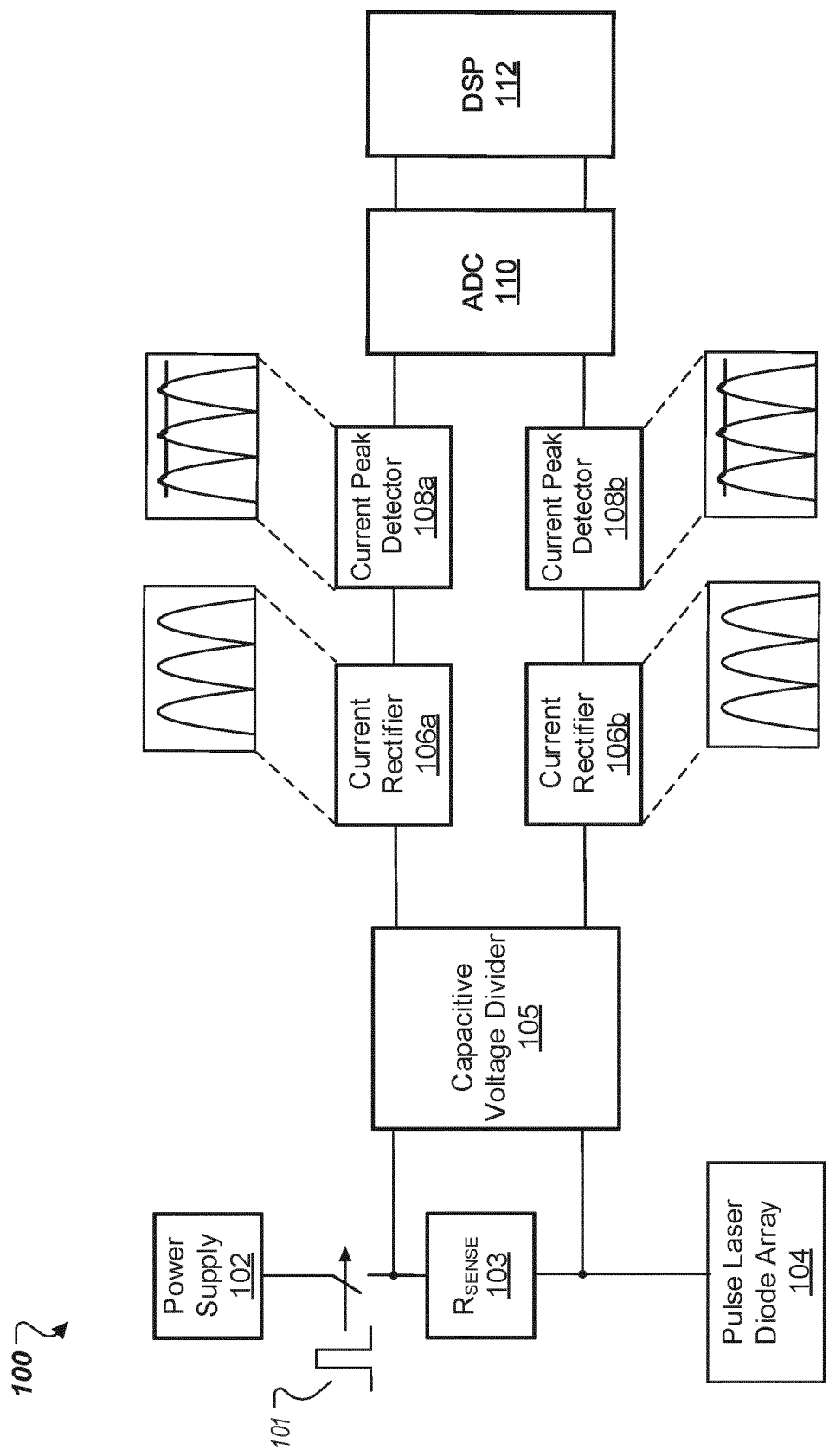
FIG. 1A is a block diagram of an example pulsed laser diode current sensing apparatus.
Figure 1B:
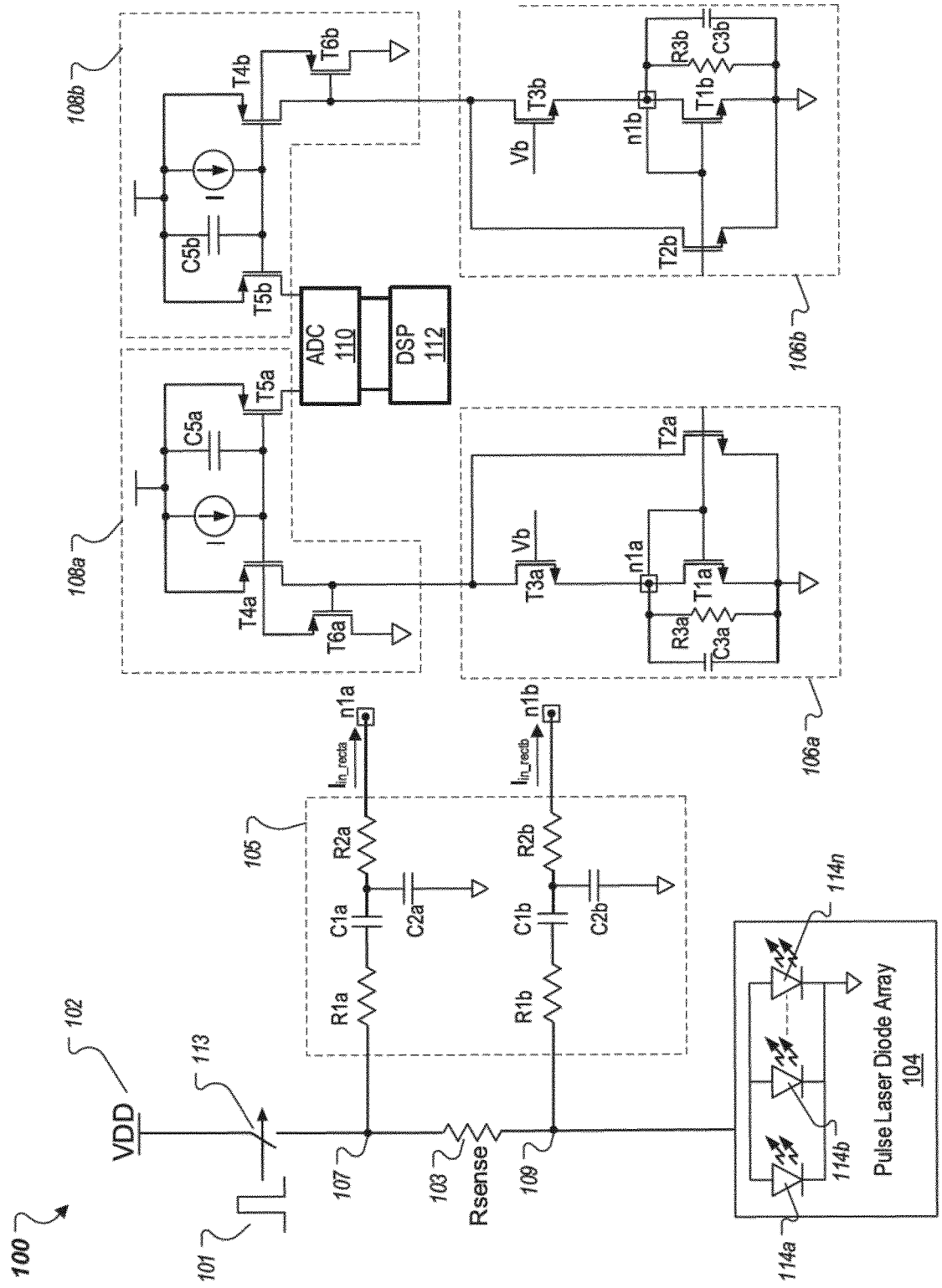
FIG. 1B is an example implementation of the pulsed laser diode current sensing apparatus of FIG. 1A.

FIG. 1A is a block diagram of an example pulsed laser diode current sensing apparatus 100. FIG. 1B is an exemplary implementation of a circuit diagram of the pulsed laser diode current sensing apparatus 100. The pulsed laser diode current sensing apparatus 100 includes a sense resistor (Rsense) 103, a pulse laser diode array 104, a capacitive voltage divider (CVD) 105, two current rectifier circuits 106a and 106b, two current peak detector circuits 108a and 108b, an analog-to-digital converter (ADC) 110 (also referred to herein as converter 110), and a digital signal processing (DSP) unit 112. The pulsed laser diode current sensing apparatus 100 can further include a pulsed laser driver 101 that pulses DC input power from an input power supply 102. These components may be implemented as an integrated circuit.

The pulse laser diode array 104 is electrically coupled to a node 109 which is electrically coupled to a bottom end of the sense resistor 103, and a second input of the CVD 105. The pulse laser diode array 104, as shown in FIG. 1B, includes a plurality of photodiodes 114*a*, 114*b*, 114*n*, etc. (also referred to herein as photodiodes 114). The pulse laser diode array 104 generates a photo-current IPD. The photo-current IPD flows through each photodiode 114, the sense resistor 103, and the second input of the CVD 105. The sense resistor 103 is operable to traverse pulsed laser current to the pulse laser diode array 104. The voltage V1*a* at the top of the sense resistor 103 is measured at node 107, and the voltage V1*b* at the bottom of the sense resistor 103 is measured at node 109. Voltage V1*a*, V1*b* can be calculated utilizing the output current ($I_{in\_rect}$) equation for the CVD 105 further discussed herein.

In some implementations, the pulse laser diode array 104 is connected to the integrated circuit as an external component. Alternatively, the pulse laser diode array 104 can be a part of the integrated circuit in some embodiments. The pulsed laser diode current sensing apparatus can be considered a pulsed laser diode current sensing arrangement. In some embodiments, the pulsed laser diode current sensing arrangement is used as LiDAR system.

The CVD 105 includes a first input node electrically coupled to node 107 and a second input node electrically coupled to node 109. The first and second input nodes are electrically coupled to the top and bottom, respectively, of the sense resistor 103. The node 107 is also electrically coupled to the DC input voltage from the power supply 102. The node 109 is also electrically coupled to the pulse laser diode array 104. The capacitive network of the CVD 105 is operable to scale down a high voltage across the sense resistor 103. For example, the high voltages across the sense resistor can range from 5V to 15V, and the CVD 105 can scale down the voltages to maximum voltage rating of the typical submicron CMOS technology, depending on the specific arrangement and tolerances of the components of the CVD 105.

As shown in FIG. 1B, an exemplary capacitive network for the CVD 105 includes R1*a*, C1*a*, R2*a*, and C2*a* electrically coupled to the first input node 107 (top of sense resistor 103), and R1*b*, C1*b*, R2*b*, and C2*b* electrically coupled to the second input node 109 (bottom of sense resistor 103). In some implementations, other capacitive networks may be used to scale down the voltage across the sense resistor 103. The output of the scaled down voltage for the top of the sense resistor 103 is electrically coupled to node n1*a*, which is electrically coupled to the first current rectifier circuit 106*a*. The output of the scaled down voltage for the bottom of the sense resistor 103 is electrically coupled to node n1*b*, which is electrically coupled to the second current rectifier circuit 106*b*. Additionally, the capacitive network for the CVD 105 is electrically coupled to a third resistor (R3*a*, R3*b*) and a third capacitor (C3*a*, C3*b*) connected in parallel to ground at each respective node (n1*a*, n1*b*) at current rectifier circuits (106*a*, 106*b*). The scaled down output currents ($I_{in\_recta}$, $I_{in\_rectb}$) from the top and bottom of the CVD 105 to each current rectifier circuit 106*a*, 106*b* can be calculated by the equation:

$$\frac{I_{in\_rect}}{V1} = \frac{S^2(C3C1R3) + SC1}{S^2(C3C1R2R3 + C2C3R2R3 + C3C1R1R3) + S(C1R3 + C1R2 + C3R3 + C2R3 + C2R2) + 1}$$

where $I_{in\_rect}$ is the output current from either the top or bottom of the CVD 105 and the input current to either the first or second current rectifier circuit 106*a*, 106*b*, respectively, V1 is the voltage at either the top (V1*a*) or bottom (V1*b*) of the sense resistor 103, each resistor R1, R2, and R3 is the resistance of the resistor R1*a,b*, R2*a,b*, and R3*a,b* respectively, each capacitor C1, C2, and C3 is the capacitance of the capacitors C1*a,b*, C2*a,b*, and C3*a,b* respectively, and S is a complex variable of frequency.

The current rectifier circuits 106*a* and 106*b* each process the current outputs from the CVD 105. As shown in FIG. 1B, the current rectifier circuit 106*a* includes switches T1*a*, T2*a*, and T3*a*, and is electrically coupled to the first output of the CVD 105 (top of sense resistor 103) at node n1*a*. The current rectifier circuit 106*b* includes switches T1*b*, T2*b*, and T3*b*, and is electrically coupled to the second output of the CVD 105 (bottom of sense resistor 103) at node n1*b*. The current rectifier circuits 106*a* and 106*b* are each operable to convert the scaled down voltage to a scaled down current and rectify the scaled down current from the CVD 105 to a rectified current signal.

In some implementations, a different circuit arrangement may be used for each current rectifier circuit 106*a* and 106*b* for scaling down the voltage to a scaled down current, rectifying the scaled down current, and sending as an output the scaled current of the pulsed laser driver current. In some implementations, each current rectifier circuit 106*a* and 106*b* is operable to receive a scaled voltage from the CVD 105, convert the scaled voltage to a scaled current, rectify the scaled current, and provide, for output, the rectified scaled current at the output of the respective current rectifier 106*a* and 106*b*.

The current peak detector circuits 108*a* and 108*b* output the scaled peak current level of the pulsed laser driver current. As shown in FIG. 1B, the input of the current peak detector circuit 108*a* includes switches T4*a*, T5*a*, and T6*a*, and a capacitor C5*a*. The current peak detector circuit 108*a* is electrically coupled to the output of the current rectifier circuit 106*a* (top of sense resistor 103). The input of the current peak detector circuit 108*b* includes switches T4*b*, T5*b*, and T6*b*, and a capacitor C5*b*. The current peak detector circuit 108*b* is electrically coupled to the output of the current rectifier circuit 106*b* (bottom of sense resistor 103). The current peak detector circuits 108*a* and 108*b* are each operable to detect a peak current level of the rectified current signal from the current rectifier circuits 106*a* and 106*b*, respectively.

In some implementations, a different circuit arrangement may be used for each current peak detector circuits 108*a* and 108*b* to output the scaled peak current levels of the pulsed laser driver current. In some implementations, each current peak detector circuit 108*a* and 108*b* is operable to receive a rectified scaled current from a current rectifier, determine a peak current level of the rectified scaled current, and provide, for output, the peak current level of the rectified scaled current at the output of the respective current peak detector 108*a* or 108*b*.

Each current rectifier circuit 106*a* and 106*b* includes a plurality of switches (T1*a*, T2*a*, T3*a*, T1*b*, T2*b*, and T3*b*). Similarly, each current peak detector circuit 108*a* and 108*b* includes a plurality of switches (T4*a*, T5*a*, T6*a*, T4*b*, T5*b*, and T6*b*). In some implementations, the switches are MOSFETS. Each switch includes a first terminal, a second terminal, and a third terminal, and the third terminal of the first switch receives a control signal that places the first switch in either a closed state in which a conduction path is established between the first and second terminals, or an open state in which the conduction path is eliminated between the first and second terminals. In some implementations, each switch operates at a magnitude limit for the switching voltage of substantially half of the DC input voltage.

The converter 110 converts an analog signal to a digital signal. The converter 110, as shown in FIGS. 1A and 1B, is electrically coupled to the T5*a* and T5*b* switches of the current peak detector circuits 108*a* and 108*b*, respectively. The converter 110 receives the analog signals from the outputs of the current peak detector circuits 108*a* and 108*b* and convert those analog signals to respective digital signals. The converter 110 is electrically coupled to the DSP unit 112, and the converter 110 is operable to send the respective digital signals to the DSP unit 112. In some implementations, the digital output signal from the converter 110 is indicative of the photocurrent generated by the pulse laser diode array 104. In some implementations, the converter 110 is operable to perform signal conditioning according to a voltage mode or a current mode.

The DSP unit 112 is electrically coupled to the output of the converter 110. The DSP unit 112 is operable to detect, from the received digital output signals from the converter 110, the rectified output current and the detected peak current at the top and the bottom of the sense resistor 103. For example, the DSP unit 112 analyzes the digital signals from the converter 110, and can determine the rectified output current and the detected peak current from the top and the bottom of the sense resistor 103. Additionally, the DSP unit 112 is further operable to calculate a difference in peak currents between the determined peak current levels at the top and the bottom of the sense resistor 103.

In some implementations, the DSP unit 112 calculates a difference in peak currents between the determined peak current levels at the top and the bottom of the sense resistor 103. For example, the received digital output signals from the current peak detector circuits 108*a* and 108*b* may include a current level at the top of the sense resistor 103 of 300 µA and a current level at the bottom of the sense resistor 103 of 190 µA. The DSP unit 112 would decide the difference between the two current levels at 110 µA. The differences in current at the top and bottom of the sense resistor 103 are shown and further described below with reference to FIGS. 2-4.

As shown in FIGS. 1A and 1*i*, the DC input voltage from the power supply 102 is pulsed by a laser driver 101 at an input switch 113 electrically coupled to the first input node of the CVD 105 (top of sense resistor 103). The pulsed laser driver 101 is operable to pulse the DC input power from the input power supply 102. For example, the pulsed multi-channel system can provide peak current up to 10 A and a corresponding fast rise-time of Ins or less, and a pulse duration of 3 ns. In some implementations, the power supply 102 can be a range for the selected CMOS technology used. For example, the VDD input voltage of the power supply 102 for the exemplary pulsed laser diode current sensing apparatus 100 shown in FIG. 1 can range from 20V to 25V.

Diagrams for the detected output currents measured for the top and the bottom of sensor resistor 103 of the pulsed laser diode current sensing apparatus 100 are described below with reference to FIGS. 2-4.

Figure 2:
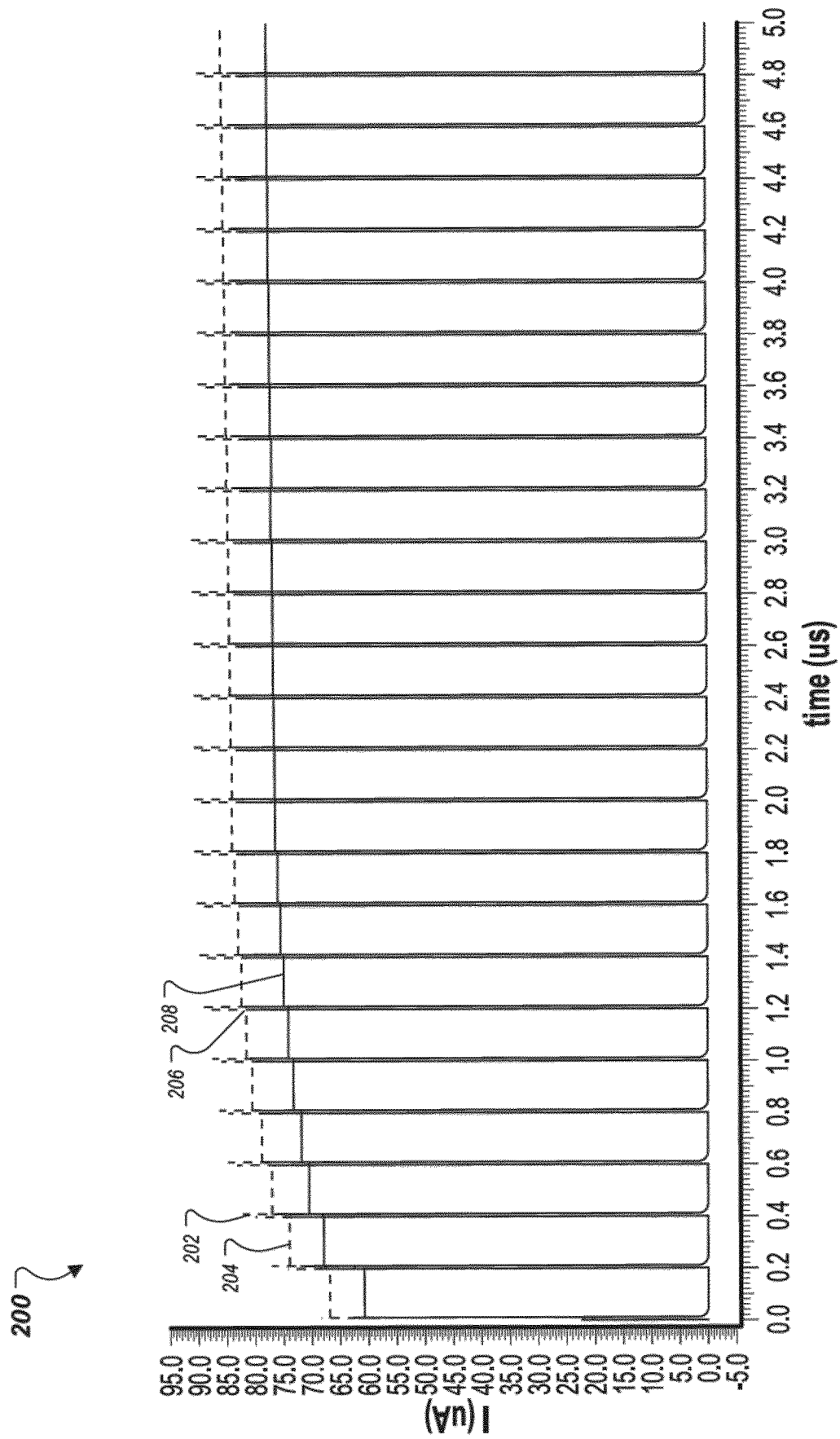
FIGS. 2-4 are example diagrams of current pulses at rectifiers and peak detector outputs of an example pulsed laser diode current sensing apparatus.

FIG. 2 is a diagram 200 of rectified output currents and detected peak currents measured for the sense resistor 103 of the pulsed laser diode current sensing apparatus 100 as shown in FIGS. 1A and 1B. In this example, several input pulse currents are measured with a pulse width of 0.2 µs over a total period of 5 µs. In particular, waveform 202 represents rectified output current measured at the top of sense resistor 103 (e.g., the output of the current rectifier 106*a*) and waveform 204 represents the detected peak current corresponding the top of sense resistor 103 (e.g., the output of the current peak detector 108*a*). Similarly, waveform 206 represents rectified output current measured at the bottom of sense resistor 103 (e.g., the output of the current rectifier 106*b*) and waveform 208 represents the detected peak current corresponding the bottom of sense resistor 103 (e.g., the output of the current peak detector 108*b*).

Figure 3:
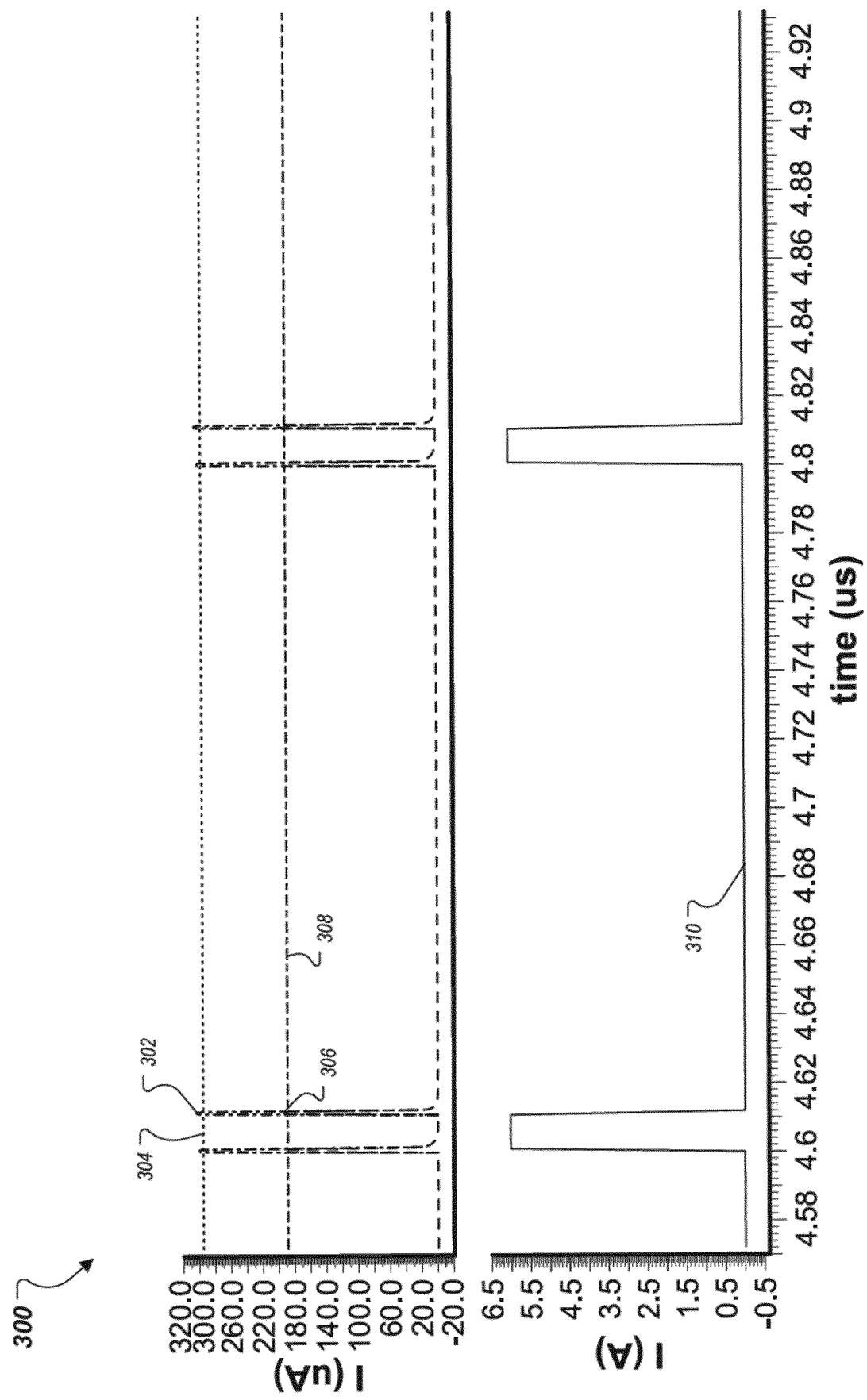

FIG. 3 is a diagram 300 of rectified output currents and detected peak currents measured for the sense resistor 103 of the pulsed laser diode current sensing apparatus 100 as shown in FIGS. 1A and 1B with two example input pulse currents. In this example, the two input pulses are shown for the input pulse current 310. The input pulses have a rise/fall time of ins, a pulse width of 10 ns, and a 6 A amplitude. In particular, waveform 302 represents rectified output current measured at the top of sense resistor 103 (e.g., the output of the current rectifier 106*a*) and waveform 304 represents the detected peak current corresponding the top of sense resistor 103 (e.g., the output of the current peak detector 108*a*). Similarly, waveform 306 represents rectified output current measured at the bottom of sense resistor 103 (e.g., the output of the current rectifier 106*b*) and waveform 308 represents the detected peak current corresponding the bottom of sense resistor 103 (e.g., the output of the current peak detector 108*b*).

In some implementations, the input pulses can have a different rise/fall time and pulse width modulations. For example, the rise/fall time may be anywhere from 600 µs to 2 ns, and the pulse width may be anywhere from 3 ns to 20 ns.

Figure 4:
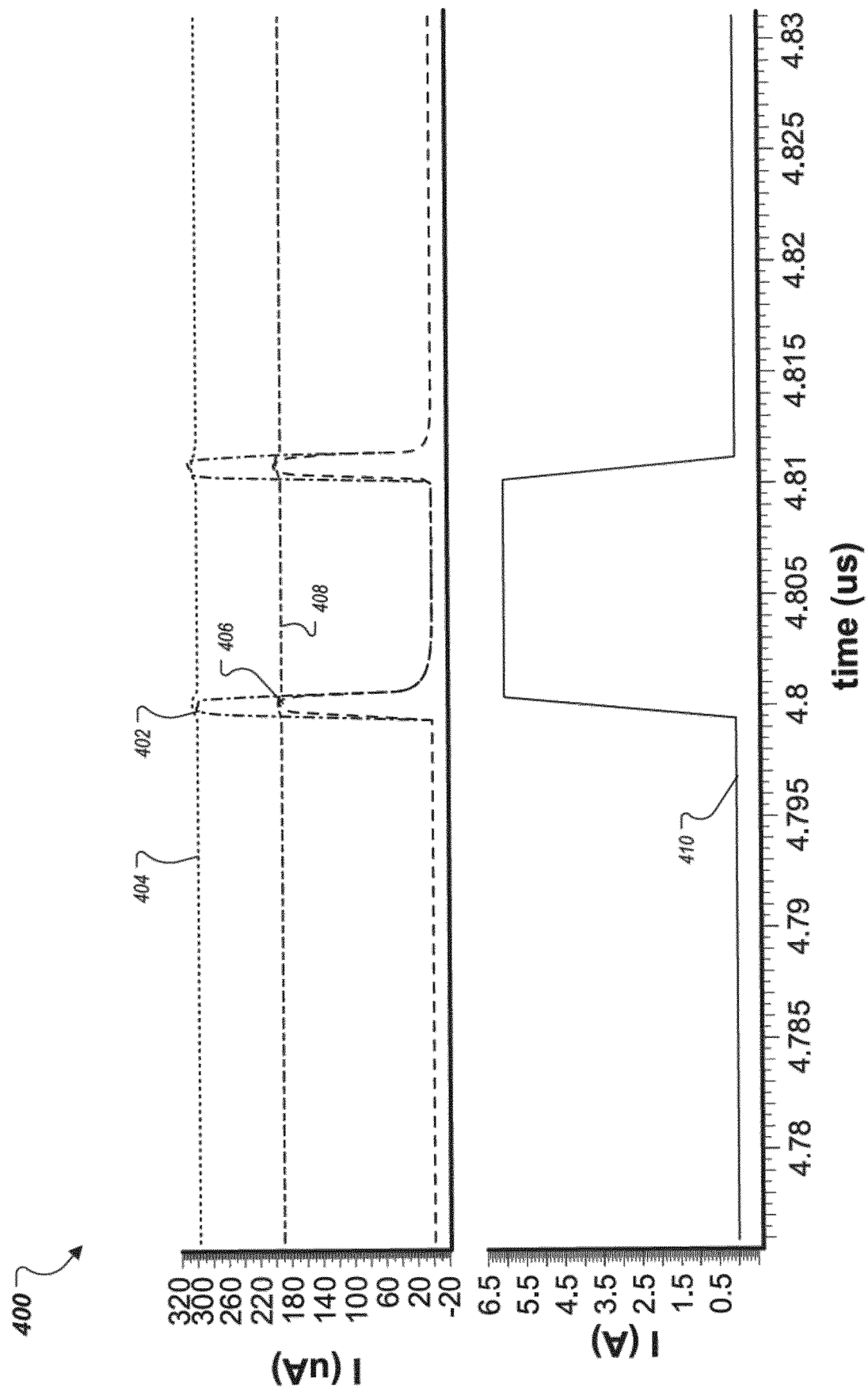

FIG. 4 is a diagram 400 of rectified output currents and detected peak currents measured for the sense resistor 103 of the pulsed laser diode current sensing apparatus 100 as shown in FIGS. 1A and 1B with one example input pulse current. In this example, one input pulse is shown for the input pulse current 410. The input pulse has a rise/fall time of ins, a pulse width of 10 ns, and a 6 A amplitude. In particular, waveform 402 represents rectified output current measured at the top of sense resistor 103 (e.g., the output of the current rectifier 106*a*) and waveform 404 represents the detected peak current corresponding the top of sense resistor 103 (e.g., the output of the current peak detector 108*a*). Similarly, waveform 406 represents rectified output current measured at the bottom of sense resistor 103 (e.g., the output of the current rectifier 106*b*) and waveform 408 represents the detected peak current corresponding the bottom of sense resistor 103 (e.g., the output of the current peak detector 108*b*).

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

While this specification contains many specific implementation details, these should not be construed as limitations on the scope of any features or of what may be claimed, but rather as descriptions of features specific to particular embodiments. Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not necessarily be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Accordingly, other implementations are within the scope of the following claims.

The invention claimed is:

1. An apparatus, comprising:
a pulse laser diode array;
a sense resistor operable to traverse pulsed laser current to the pulse laser diode array;
a capacitive voltage divider (CVD) electrically coupled to the pulse laser diode array and comprising:
  a first input node for receiving a direct current (DC) input voltage, wherein a top end of the sense resistor is electrically coupled to the first input node;
  a second input node for receiving a pulsed laser current generated by the pulse laser diode array, wherein a bottom end of the sense resistor is electrically coupled to the second input node; and
  a first and a second output node that each respectively output a scaled DC output voltage;
a first current rectifier electrically coupled to the first output node of the CVD;
a second current rectifier electrically coupled to the second output node of the CVD;
a first current peak detector electrically coupled to an output of the first current rectifier;
a second current peak detector electrically coupled to an output of the second current rectifier;
an analog-to-digital converter (ADC) electrically coupled to an output of the first current peak detector and an output of the second current peak detector and operable to convert the analog outputs from each current peak detector to a digital output signal; and
a digital signal processing (DSP) unit electrically coupled to an output of the ADC and operable to detect, from the digital output signal, a current peak pulse at the top and the bottom of the sense resistor.

2. The apparatus of claim 1, wherein the DSP unit is further operable to calculate a difference in peak currents between the determined peak current levels at the top and the bottom of the sense resistor.

3. The apparatus of claim 1, wherein the DC input voltage is pulsed by a laser driver at an input switch electrically coupled to the first input node of the CVD.

4. The apparatus of claim 1, wherein the CVD is operable to scale a voltage generated between the pulse laser diode array and the DC input voltage across the sense resistor.

5. The apparatus of claim 1, wherein each current rectifier is operable to: receive a scaled voltage from the CVD; convert the scaled voltage to a scaled current; rectify the scaled current; and provide, for output, the rectified scaled current at the output of the respective current rectifier.

6. The apparatus of claim 1, wherein each current peak detector is operable to:
receive a rectified scaled current from a respective current rectifier;
determine a peak current level of the rectified scaled current; and
provide, for output, the peak current level of the rectified scaled current at the output of the respective current peak detector.

7. The apparatus of claim 1, wherein the ADC is operable to perform signal conditioning according to a voltage mode or a current mode.

8. The apparatus of claim 1, wherein the first output node of the CVD comprises a scaled output voltage for the top end of the sense resistor and the second output node of the CVD comprises a scaled output voltage for the bottom end of the sense resistor.

9. The apparatus of claim 1, wherein the digital output signal is indicative of the photocurrent generated by the pulse laser diode array.

10. A method for current peak detection comprising:
generating, by a pulse laser diode array, a photocurrent (IPD), wherein the photocurrent generates an offset voltage across a sense resistor electrically coupled between the pulse laser diode array and a direct current (DC) input voltage source;
converting, by a capacitive voltage divider (CVD) electrically coupled to the pulse laser diode array, the offset voltage across the sense resistor to a scaled down voltage;
converting, by a rectifier circuit electrically coupled to the CVD, the scaled down voltage to a scaled down current;
rectifying, by the rectifier circuit, the scaled down current to a rectified current signal;
detecting, by a current peak detector circuit electrically coupled to the rectifier circuit, a peak level of the rectified current signal;
converting, by an analog-to-digital converter (ADC), the rectified current signal into a digital output signal; and
determining, by a digital signal processing (DSP) unit electrically coupled to the ADC, and based on the digital output signal, a peak current pulse at a top and a bottom of the sense resistor.

11. The method of claim 10, further comprising:
calculating, by the DSP, a difference in peak currents between the determined peak current levels at the top and the bottom of the sense resistor.

12. The method of claim 10, wherein the DC input voltage is pulsed by a laser driver at an input switch electrically coupled to a node at the top of the sense resistor.

13. The method of claim 12, wherein the rectifier circuit comprises:
- a first current rectifier electrically coupled to a first output node of the CVD and a first input node of the current peak detector circuit; and
- a second current rectifier electrically coupled to a second output node of the CVD and a second input node of the current peak detector circuit.

14. The method of claim 13, wherein the current peak detector circuit comprises:
- a first current peak detector electrically coupled to an output node of the first current rectifier and a first input node of the ADC; and
- a second current peak detector electrically coupled to an output node of the second current rectifier and a second input node of the ADC.

15. The method of claim 10, wherein converting the rectified current signal into a digital output signal comprises performing signal conditioning according to a voltage mode or a current mode of the ADC.

* * * * *